United States Patent
Luo

(10) Patent No.: US 12,219,817 B2
(45) Date of Patent: Feb. 4, 2025

(54) DISPLAY SUBSTRATE WITH PIXEL DEFINE LAYER WITHIN COLOR SUBPIXEL

(71) Applicant: BOE Technology Group Co., Ltd., Beijing (CN)

(72) Inventor: Chengyuan Luo, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 104 days.

(21) Appl. No.: 17/512,645

(22) Filed: Oct. 27, 2021

(65) Prior Publication Data
US 2022/0271108 A1    Aug. 25, 2022

(30) Foreign Application Priority Data
Feb. 22, 2021    (CN) .......................... 202110198067.0

(51) Int. Cl.
| | | |
|---|---|---|
| H01L 27/32 | (2006.01) | |
| H01L 51/00 | (2006.01) | |
| H01L 51/52 | (2006.01) | |
| H10K 50/80 | (2023.01) | |
| H10K 59/122 | (2023.01) | |
| H10K 59/35 | (2023.01) | |
| H10K 71/13 | (2023.01) | |

(52) U.S. Cl.
CPC .......... *H10K 59/122* (2023.02); *H10K 50/80* (2023.02); *H10K 59/353* (2023.02); *H10K 71/135* (2023.02)

(58) Field of Classification Search
CPC .......................... H10K 59/122; H10K 59/353
See application file for complete search history.

(56) References Cited

U.S. PATENT DOCUMENTS

| | | | |
|---|---|---|---|
| 2014/0197396 A1* | 7/2014 | Madigan .............. | H10K 50/818 |
| | | | 438/34 |
| 2016/0284766 A1* | 9/2016 | Wang ................... | H10K 59/353 |
| 2018/0269268 A1* | 9/2018 | Cai ....................... | H10K 59/353 |
| 2019/0206950 A1* | 7/2019 | Chen ................. | G02F 1/133514 |
| 2019/0237518 A1* | 8/2019 | Sun ........................ | H10K 50/11 |
| 2020/0185471 A1 | 6/2020 | Lee et al. | |

(Continued)

FOREIGN PATENT DOCUMENTS

| | | | |
|---|---|---|---|
| CN | 109713007 A | 5/2019 | |
| KR | 10-2020-0071428 A | 6/2020 | |
| WO | WO-2018196144 A1 * | 11/2018 | ............. H01L 27/32 |

OTHER PUBLICATIONS

The First Office Action dated Jun. 29, 2022 for Chinese Patent Application No. 202110198067.0 and English Translation.

*Primary Examiner* — Peter Bradford
(74) *Attorney, Agent, or Firm* — Ling Wu; Stephen Yang; Ling and Yang Intellectual Property

(57) ABSTRACT

A display substrate, an ink jet printing method and a display apparatus are provided. The display substrate includes a base substrate and a pixel define layer disposed on the base substrate, wherein the pixel define layer includes first define layers and a second define layer, a printing region is formed on the base substrate between the first define layers, and the second define layer is disposed on the printing region and divides the printing region into at least two sub-printing regions, and a height of the first define layers is greater than that of the second define layer in a direction perpendicular to the base substrate.

12 Claims, 3 Drawing Sheets

(56) References Cited

U.S. PATENT DOCUMENTS

2020/0194520 A1* 6/2020 Seo .................... H10K 59/353
2020/0212124 A1* 7/2020 Shao ................... H10K 59/122
2021/0335907 A1  10/2021 Xie et al.

* cited by examiner

DISPLAY SUBSTRATE WITH PIXEL DEFINE LAYER WITHIN COLOR SUBPIXEL

CROSS-REFERENCE TO RELATED APPLICATION

The present application claims priority of Chinese Patent Application No. 202110198067.0 filed to the CNIPA on Feb. 22, 2021, the content of which is hereby incorporated by reference.

TECHNICAL FIELD

Embodiments of the present disclosure relate to, but are not limited to, the field of display technology, and particularly relate to a display substrate, an ink jet printing method thereof and a display apparatus.

BACKGROUND

An Organic Light-Emitting Diode (OLED) has advantages such as self-luminescence, fast response, wide viewing angle, high brightness, bright color, lightweight and thinness, etc., compared with a Liquid Crystal Display (LCD), with its application range grows wider, and the OLED is considered as the most promising display apparatus.

At present, there are mainly two deposition methods for thin films of organic light-emitting devices, vacuum evaporation and solution process. First, the vacuum evaporation is suitable for organic small molecules, with good film formation uniformity and relatively mature technology, but requires large equipment investment and has low material utilization rate and low mask alignment precision for large-size products. Second, the solution process, which includes spin coating, ink jet printing, nozzle coating, etc., is suitable for polymer materials and soluble small molecules. It features in low equipment costs and outstanding advantages in large-scale and large-size production.

Ink jet printing film formation technology is considered as an important way to achieve mass production of large-size OLEDs due to its high material utilization rate.

In the process of ink jet printing, it is necessary to make a pixel define layer (PDL) on the base substrate in advance to restrict printing ink droplets to accurately flow into designated R/G/B sub-pixel regions. The printing ink droplets need to be adequately spread in the sub-pixel regions without overflowing, and a pixel film layer is formed after drying. To achieve high resolution, the sub-pixel regions are required to be small and dense. However, based on the current printing technology, the diameter of an ink droplet formed by a printer nozzle is substantially the same as the size of a sub-pixel region, making it difficult to accurately control the ink droplet to fall into the sub-pixel region and ensure that the thickness of the pixel film layer in each sub-pixel region is consistent.

SUMMARY

The following is a summary of the subject matters described in the present disclosure in detail. This brief description is not intended to limit the scope of protection of the claims.

An embodiment of the present disclosure provides a display substrate, which includes a base substrate and a pixel define layer disposed on the base substrate, wherein the pixel define layer includes first define layers and a second define layer, a printing region is formed on the base substrate between the first define layers, and the second define layer is disposed on the printing region and divides the printing region into at least two sub-printing regions, and a height of the first define layer is greater than a height of the second define layer in a direction perpendicular to the base substrate.

In an exemplary embodiment, in the direction perpendicular to the base substrate, the height of the second define layer is ⅓ to ¾ of the height of the first define layers.

In an exemplary embodiment, in the direction perpendicular to the base substrate, the height of the first define layers is 1 μm-5 μm.

In an exemplary embodiment, at least two adjacent printing regions are disposed on the base substrate, and sub-printing regions in at least two of the adjacent printing regions are combined to form a pixel region.

In an exemplary embodiment, in the direction parallel to the base substrate, the pixel region is triangular.

In an exemplary embodiment, in the direction parallel to the base substrate, the pixel region is regular polygonal.

In an exemplary embodiment, in the direction parallel to the base substrate, the printing region is regular hexagonal, and the second define layer is disposed along a diagonal direction of the printing region, and evenly divides the printing region to form at least two sub-printing regions.

In an exemplary embodiment, the display substrate further includes a drive circuit layer disposed on the base substrate, wherein the drive circuit layer includes a plurality of drive transistors, and the drive transistors are in one-to-one correspondence with the sub-printing regions in the printing region.

In an exemplary embodiment, in the direction perpendicular to the base substrate, a first define layer includes a first hydrophilic material layer and a first hydrophobic material layer which are stacked, and the first hydrophobic material layer is located on a side of the first hydrophilic material layer away from the base substrate.

In an exemplary embodiment, in the direction perpendicular to the base substrate, the second define layer includes a second hydrophilic material layer; or, the second define layer includes a second hydrophilic material layer and a second hydrophobic material layer located on a side of the second hydrophilic material layer away from the base substrate.

An embodiment of the present disclosure further provides a display apparatus which includes any one of the above display substrates.

An embodiment of the disclosure further provides an ink jet printing method for a display substrate applied to any one of the aforementioned display substrates, and the method includes:

ejecting printing ink droplets into a printing region of the display substrate through a nozzle, wherein the printing ink droplets cover at least two sub-printing regions in the printing region; and making the printing ink droplets form an organic functional layer.

In an exemplary embodiment, the organic functional layer on adjacent sub-printing regions in the printing region are disconnected at the second define layer.

In an exemplary embodiment, the organic functional layer is a continuous film layer, and a vertical projection of the organic functional layer on the base substrate overlaps with a vertical projection of the printing region on the base substrate.

Of course, an implementation of any product or method in the embodiments of the present disclosure does not need to achieve all the advantages mentioned above at the same time. Other features and advantages of the present disclosure will be set forth in the following embodiments of the description, and in part will become apparent from the embodiments of the description, or be learned by practice of the present disclosure. Purposes and other advantages of the technical solutions of the present disclosure may be achieved and acquired by structures specified in the detailed description, claims and drawings.

Other aspects will become apparent upon reading and understanding the drawings and the detailed description.

BRIEF DESCRIPTION OF DRAWINGS

The drawings provide a further understanding of technical solutions of the present disclosure, form a part of the specification, and are used to explain, together with the embodiments of the present disclosure, the technical solutions of the present disclosure and not intended to form limitations on the technical solutions of the present disclosure. The shape and size of each component in the drawings do not reflect true scales and only to be used to schematically illustrate contents of the present disclosure.

DETAILED DESCRIPTION

Specific implementations of the present disclosure will be described further in detail below with reference to the accompanying drawings and embodiments. The following embodiments serve to illustrate the present disclosure, but are not intended to limit the scope of the present disclosure. The embodiments in the present disclosure and the features in the embodiments may be randomly combined with each other if there is no conflict.

Figure 1:
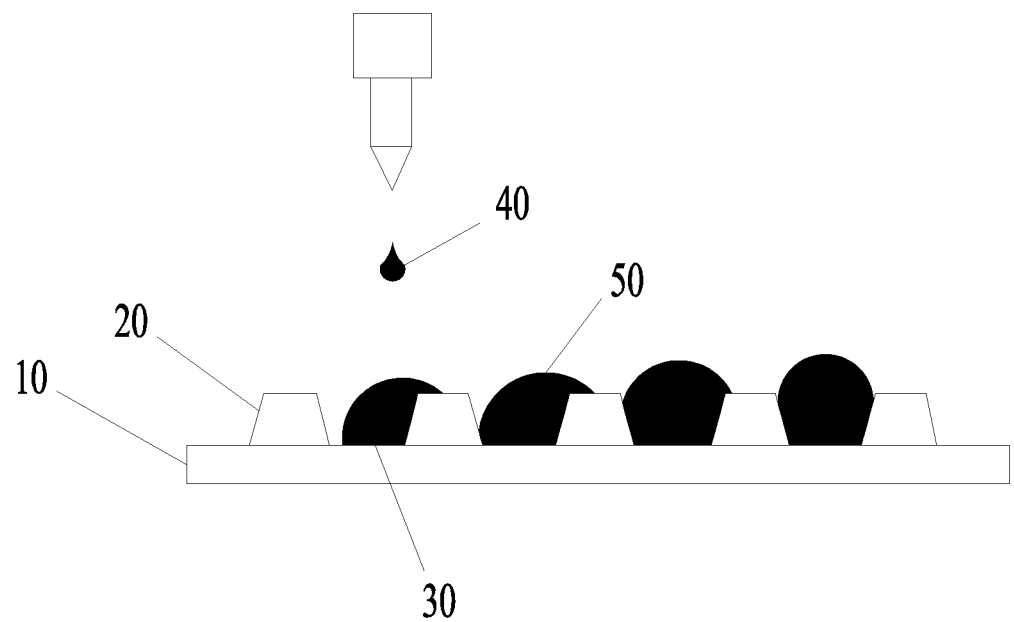
FIG. 1 is a schematic diagram of a display substrate after a pixel film layer is formed through an ink jet printing process.

FIG. 1 is a schematic diagram of a display substrate after a pixel film layer is formed through an ink jet printing process. As shown in FIG. 1, the display substrate includes a base substrate 10 and pixel define layers 20 disposed on the base substrate 10. Sub-pixel regions 30 for accommodating print ink droplets 40 are formed on the base substrate 10 between the pixel define layers 20. In the process of ink jet printing, the printing ink droplets 40 need to accurately drop into the sub-pixel regions 30 and an organic functional layer 50 is formed after drying. Based on the current printing technology, the diameter of a printing ink droplet 40 formed by the printer nozzle is substantially the same as the size of a sub-pixel region 30, and it is difficult to accurately control the printing ink droplet 40 to fall to the predetermined position of the sub-pixel region 30 by dropping, resulting in uneven spreading of the printing ink droplet 40 in the sub-pixel region 30, which further causes an uneven thickness of the organic functional layer 50 formed by the printing ink droplets 40 as well as uneven light emission of the display apparatus.

An embodiment of the present disclosure provides a display substrate, which includes a base substrate and a pixel define layer disposed on the base substrate, and the pixel define layer includes first define layers and a second define layer, wherein a printing region is formed on the base substrate between the first define layers, and the second define layer is disposed on the printing region and divides the printing region into at least two sub-printing regions. A height of the first define layers is greater than that of the second define layer in a direction perpendicular to the base substrate.

The technical solutions of the embodiments of the present disclosure will be illustrated in detail below by the embodiments.

Figure 2:
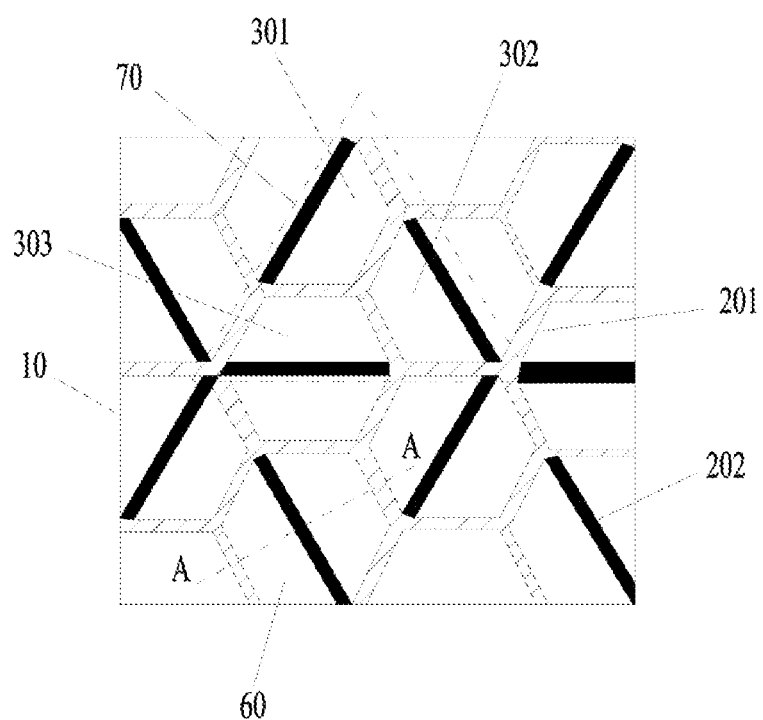
FIG. 2 is a schematic diagram of a structure of a display substrate according to an embodiment of the present disclosure.
Figure 3:
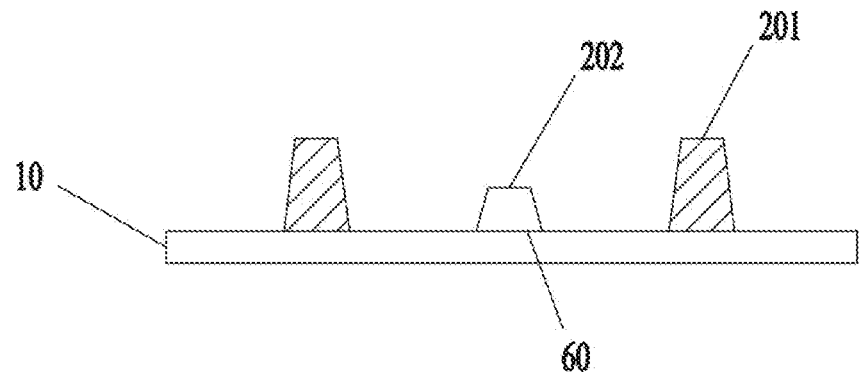
FIG. 3 is a sectional view of a display substrate according to an embodiment of the present disclosure.

FIG. 2 is a schematic diagram of a structure of a display substrate according to an embodiment of the present disclosure. FIG. 3 is a sectional view of a display substrate according to an embodiment of the present disclosure. FIG. 3 illustrates a sectional view taken along an A-A direction in FIG. 2 as an example to explain a structure of the display substrate of the present disclosure. The type of the display substrate in the embodiments of the present disclosure is not limited, for example, it may be an OLED display substrate or quantum dot display substrate. The present description takes an OLED display substrate as an example. As shown in FIG. 2 and FIG. 3, the display substrate of the embodiment of the present disclosure includes a base substrate 10 and a pixel define layer 20 disposed on the base substrate 10, wherein the pixel define layer 20 includes first define layers 201 and a second define layer 202. A printing region 60 is formed on the base substrate 10 between the first define layers 201, and the second define layer 202 is disposed on the printing region 60 and divides the printing region 60 into at least two sub-printing regions, wherein a height of the first define layers 201 is greater than that of the second define layer 202 in a direction perpendicular to the base substrate 10.

According to the embodiment of the present disclosure, the first define layers 201 form a printing region 60 on the base substrate 10, so that printing ink droplets can accurately flow into the printing region 60 under the restriction of the first define layers 201. At least two sub-printing regions are formed in the printing region 60 by the second define layer 202, so that the printing ink droplets in the printing region 60 accurately flow into the sub-printing regions under the restriction of the second define layer 202 and are spread evenly on the sub-printing regions, thereby ensuring the thickness uniformity of the film formation of the sub-pixel regions.

In an exemplary embodiment, the material of the base substrate 10 is not limited, which may be a rigid material. In an exemplary embodiment, the material may include, but is not limited to, silicon wafer, glass, mica sheet or other rigid carrier materials.

In an exemplary embodiment, in the direction perpendicular to the base substrate 10, the height of the second define layer 202 is ⅓ to ¾ of the height of the first define layers 201, so that the printing droplets will not overflow the first define layers 201, and the printing droplets in the printing region will be spread evenly under the restriction of the second define layer 202, making the printing droplets uniformly form a film. For example, the height of the first define layers 201 ranges from 1 μm to 5 μm, and the height of the second define layer 202 ranges from 0.34 μm to 3.75 μm.

In an exemplary embodiment, the base substrate 10 is provided with at least two adjacent printing regions 60, and sub-printing regions in at least two of the adjacent printing regions 60 are combined to form a pixel region 70. In an exemplary embodiment, in the direction parallel to the base substrate 10, the printing region 60 is a regular hexagon. A first define layer 201 is a regular hexagon and is disposed around the printing region 60. The second define layer 202 is disposed along a diagonal direction of the printing region 60, and two ends of the second define layer 202 are connected with the first define layers 201. The second define layer 202 evenly divides the printing region 60 into two sub-printing regions, both of which are isosceles trapezoid and symmetrically disposed with the second define layer 202 as the center line. The adjacent printing regions 60 on the substrate 10 at least include a first sub-printing region 301, a second sub-printing region 302 and a third sub-printing region 303, wherein the first sub-printing region 301, the second sub-printing region 302 and the third sub-printing region 303 are adjacent to each other. A printing region 60 on a side of the first sub-printing region 301 close to the second sub-printing region 302 and the third sub-printing region 303 is configured as a red sub-pixel region, a printing region 60 on a side of the second sub-printing region 302 close to the first sub-printing region 301 and the third sub-printing region 303 is configured as a green sub-pixel region, and a printing region 60 on a side of the third sub-printing region 303 close to the first sub-printing region 301 and the second sub-printing region 302 is configured as a blue sub-pixel region. The part of printing region 60 on the side of the first printing region 301 close to the second sub-printing region 302 and the third sub-printing region 303, the part of printing region 60 on the side of the second sub-printing region 302 close to the first sub-printing region 301 and the third sub-printing region 303, and the part of printing region 60 on the side of the third sub-printing region 303 close to the first sub-printing region 301 and the second sub-printing region 302 are combined and to form the triangle pixel region 70. Among them, adjacent printing regions 60 means that one edge of the adjacent printing regions 60 shares the first define layer 201.

In an exemplary embodiment, in the direction parallel to the base substrate 10, the pixel region 70 may be triangular to increase an effective display area of the pixel region 70.

In some embodiments, the printing region may have various shapes, such as regular or irregular shapes such as triangles, rectangles, quadrangles, pentagons, etc., which will not be repeated here in the present disclosure.

In some embodiments, the pixel region may be have various shapes, such as regular or irregular shapes such as rectangle, quadrilateral, pentagon, etc., which will not be repeated here in the present disclosure.

In an exemplary embodiment, the display substrate of the embodiment of the present disclosure further includes a drive circuit layer disposed on the base substrate 10, wherein the drive circuit layer includes a plurality of drive transistors, and the drive transistors are in one-to-one correspondence with the sub-printing regions in the printing region and are configured to drive the organic functional layers on the sub-printing regions in the printing region to emit light.

In an exemplary embodiment, in the direction perpendicular to the base substrate 10, a first define layer 201 includes a first hydrophilic material layer and a first hydrophobic material layer which are stacked, and the first hydrophobic material layer is located on a side of the first hydrophilic material layer away from the base substrate 10. The second define layer 202 includes a second hydrophilic material layer; or, the second define layer 202 includes a second hydrophilic material layer and a second hydrophobic material layer located on a side of the second hydrophilic material layer away from the base substrate 10. Among them, the first hydrophobic material layer and the second hydrophobic material layer are made of hydrophobic materials, which can restrict printing ink droplets to dropping into designated printing regions and sub-printing regions, effectively control the climbing of printing ink droplets on the first and second defined layers, and improve the uniformity of film formation. The hydrophobic material is a material having repellency to ink in which an organic electroluminescent material is dissolved. The hydrophobic material may be fluorinated polymethylmethacrylate or fluorinated polyimide. The first hydrophilic material layer and the second hydrophilic material layer are hydrophilic materials, and the first hydrophilic material layer and the second hydrophilic material layer better attract printing ink droplets by utilizing the characteristics of the hydrophilic materials, so as to ensure that the printing ink droplets are completely and adequately spread and form a film uniformly in the drying process. The hydrophilic material is a material attractive to a solution in which an organic electroluminescent material is dissolved. The hydrophilic material may be one of polyisoprene, polystyrene and epoxy resin.

A manufacturing process of the display substrate in the present embodiment includes:

In Step 1, an anode layer is formed on a base substrate. Forming an anode layer on the base substrate includes depositing a conductive thin film on the base substrate 10, patterning the conductive thin film through a patterning process, and forming an anode layer pattern (not shown in the figures) on the base substrate 10; herein, the conductive thin film may be made of a metal material, such as argentum (Ag), copper (Cu), aluminum (Al), molybdenum (Mo), or an alloy material of the above metals, such as aluminum neodymium alloy (AlNd), molybdenum niobium alloy (MoNb), or may be multi-layer metals, such as molybdenum (Mo)/copper (Cu)/molybdenum (Mo), or may be in a stacked structure formed by a metal and a translucent conductive material, such as indium tin oxide (ITO)/argentum (Ag)/indium tin oxide (ITO).

In Step 2, a pixel define layer is formed on a base substrate. Forming the pixel define layer on the base substrate includes depositing a pixel define thin film on the base substrate 10 on which the aforementioned patterns are formed; wherein the pixel define thin film is made of photosensitive material. Irradiating a gray mask plate with a light source, wherein light passes through a completely light transmittance region of the gray mask plate, so that the pixel define thin film in the completely light transmittance region becomes a completely exposed region, and the pixel define thin film in the completely exposed region is completely removed after development. The light cannot pass through a non-light transmittance region of the gray mask plate, so that the pixel define thin film in the non-light transmittance region becomes an unexposed region, and the pixel define thin film in the unexposed region is completely retained after development to form the first define layer 201. The light passes through a partially light transmittance region of the gray mask plate, so that the pixel define thin film in the partially light transmittance region becomes a partially exposed region, and the pixel define thin film in the partially exposed region is partially removed after development to form a second define layer 202. The first define layer s201 and the second define layer 202 form a pixel define layer 20, as shown in FIG. 3. The base substrate 10 between the first define layers 201 forms a printing region 60, and the second define layer 202 is disposed on the printing region 60 and divides the printing region 60 into at least two sub-printing regions. In the direction perpendicular to the base substrate 10, the height of the first define layer 201 is greater than that of the height of the second define layer 202.

In an exemplary embodiment, the base substrate may be an array substrate. Before formation of the anode layer and the pixel define layer, a drive circuit layer may be formed on the base substrate 10 in advance. The drive circuit layer includes a plurality of drive transistors, and the drive transistors are in one-to-one correspondence with the sub-printing regions in the printing region.

In an exemplary embodiment, the anode layer includes an anode located in each sub-pixel region, and the anode in each sub-pixel region may be connected with a drive transistor corresponding to the sub-pixel region through a via hole in the sub-pixel region.

Figure 4:
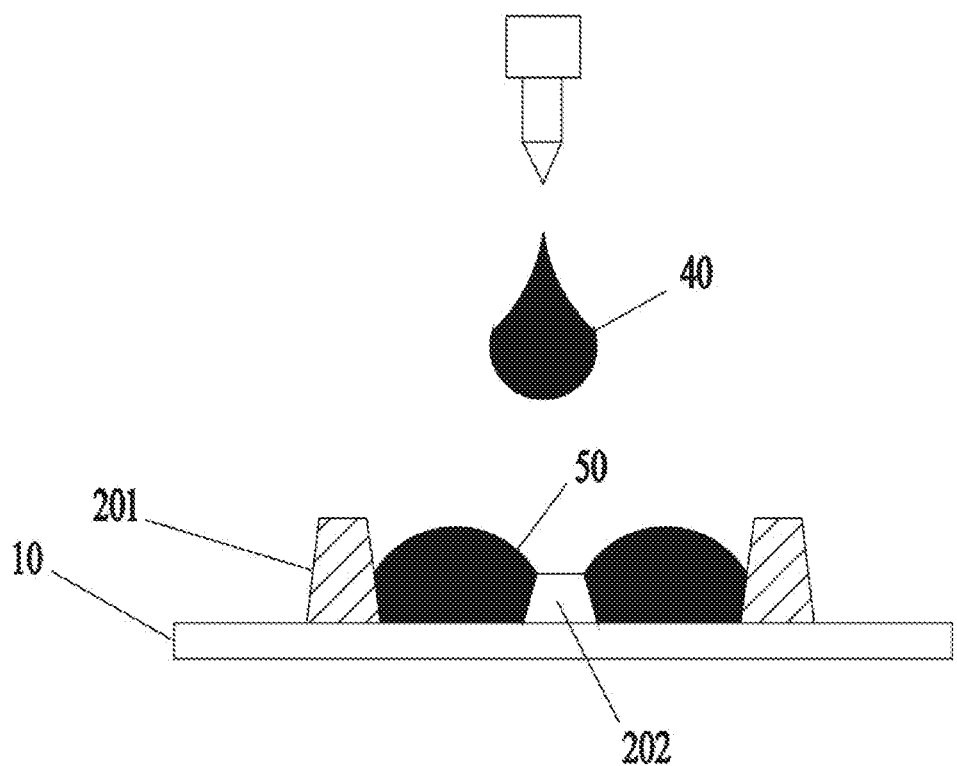
FIG. 4 is a first sectional view of a display substrate after film formation according to the embodiment of the present disclosure.

FIG. 4 is a first sectional view of a display substrate after film formation according to the embodiment of the present disclosure. An embodiment of the disclosure further provides an ink jet printing method for a display substrate, which may be applied to any one of the aforementioned display substrates, and the method includes:

ejecting printing ink droplets 40 into a printing region 60 of the display substrate through a nozzle, wherein the printing ink droplets 40 cover at least two sub-printing regions in the printing region 60; and using an evaporation process (e.g., vacuum evaporation process) to make the printing ink droplets 40 form an organic functional layer 50, as shown in FIG. 4. Among them, the organic functional layer may include one or more of the following: hole injection layer, hole transport layer, light-emitting layer, electron injection layer and electron transport layer.

In an exemplary embodiment, after the printing ink droplets 40 drop into the printing region 60, the printing ink droplets 40 are separated by the second define layer 202 on the printing region 60, so that the printing ink droplets 40 on adjacent sub-printing regions in the printing region 60 are disconnected at the second define layer 202, and then the organic functional layers 50 formed by the printing ink droplets 40 are disconnected at the second define layer 202, as shown in FIG. 4.

Figure 5:
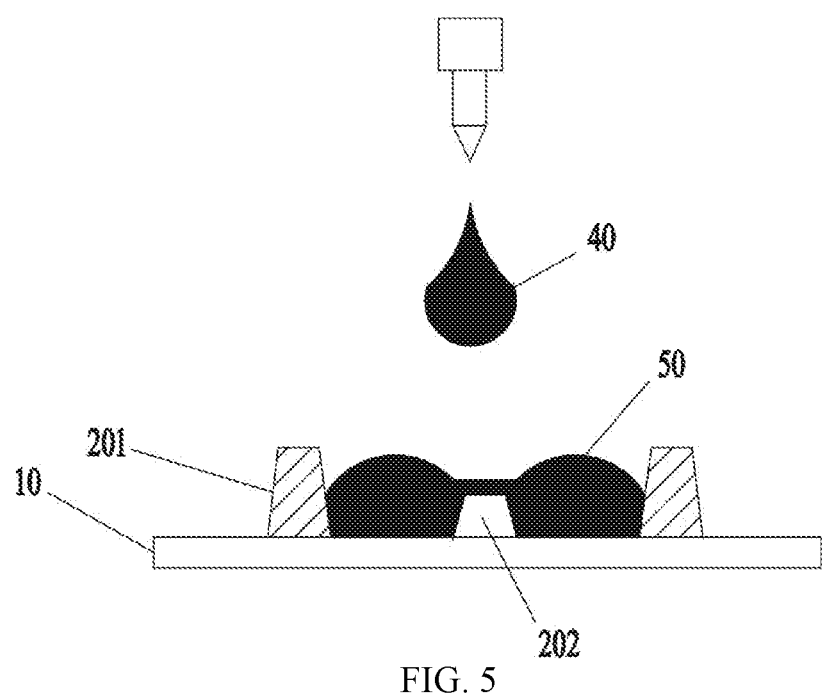
FIG. 5 is a second sectional view of a display substrate after film formation according to the embodiment of the present disclosure.

FIG. 5 is a second sectional view of a display substrate after film formation according to the embodiment of the present disclosure. In an exemplary embodiment, as shown in FIG. 5, the printing ink droplets 40 drop into and are spread in the printing region 60, and the printing ink droplets 40 cover the sub-printing regions and the second define layer 202 in the printing region 60, so that the organic functional layers 50 formed by the printing ink droplets 40 is a continuous film layer, and a vertical projection of the organic functional layer 50 on the base substrate 10 overlaps with a vertical projection of the printing region 60 on the base substrate 10.

According to the embodiment of the present disclosure, dropping printing ink droplets 40 into the printing region 60 makes the printing ink droplets 40 cover at least two sub-printing regions in the printing region 60, and the organic functional layers 50 on at least two sub-printing regions in the printing region 60 are manufactured by the same printing ink droplets 40, which can form smaller sub-pixel units without changing the accuracy of printing equipment.

An embodiment of the present disclosure further provides a display apparatus which includes any one of the above display substrates. The display apparatus may be any product or component with a display function such as a mobile phone, a tablet computer, a television, a display, a laptop computer, a digital photo frame, a navigator, etc.

In the description of the present disclosure, it should be understood that an orientation or positional relation indicated by the terms "middle", "upper", "lower", "front", "rear", "vertical", "horizontal", "top", "bottom", "inner", "outer" and the like is based on the orientation or positional relation shown in the accompanying drawings, which is only for the convenience of describing the present disclosure and simplifying the description, rather than indicating or implying that the device or element referred to must have the specific orientation, or be constructed and operated in the specific orientation, and thus cannot be interpreted as a limitation on the present disclosure.

In the description of the embodiments of the present disclosure, it should be noted that unless otherwise clearly specified and defined, the terms "install", "couple", "connect" should be broadly interpreted, for example, a connection may be a fixed connection, or a detachable connection, or an integrated connection; it may be a mechanical connection or an electrical connection; it may be a direct connection, or may be an indirect connection through an intermediary, or may be an internal connection between two elements. Those of ordinary skill in the art may understand the meanings of the terms in the present disclosure according to specific situations.

Although the embodiments disclosed in the present disclosure are as described above, the content described is only the embodiments used to facilitate the understanding of the present disclosure, and is not intended to limit the present disclosure. Anyone skilled in the art to which the present disclosure belongs can make any modifications and changes in the implementation forms and details without departing from the spirit and scope disclosed in the present disclosure. However, the scope of patent protection of the present disclosure is still subject to the scope defined by the appended claims.

What is claimed is:

1. A display substrate, comprising a base substrate and a pixel define layer disposed on the base substrate, wherein the pixel define layer comprises first define layers and a second define layer, a printing region is formed on the base substrate between the first define layers, and the second define layer is disposed on the printing region and divides the printing region into two sub-printing regions, and a height of the first define layers is greater than a height of the second define layer in a direction perpendicular to the base substrate; wherein in the direction parallel to the base substrate, the first define layer is regular hexagonal, the printing region is regular hexagonal, and the two sub-printing regions are symmetrically disposed at two sides of the second define layer;

wherein sub-printing regions in at least two of the adjacent printing regions are combined to form a pixel region; wherein in the direction parallel to the base substrate, the pixel region is triangular.

2. The display substrate according to claim 1, wherein in the direction perpendicular to the base substrate, the height of the second define layer is ⅓ to ¾ of the height of the first define layers.

3. The display substrate according to claim 2, wherein in the direction perpendicular to the base substrate, the height of the first define layers is 1 μm-5 μm.

4. The display substrate according to claim 1, wherein the second define layer is disposed along a diagonal direction of the printing region, and evenly divides the printing region to form the two sub-printing regions, wherein each of the two sub-sprinting regions is an isosceles trapezoid.

5. The display substrate of claim 1, further comprising a drive circuit layer disposed on the base substrate, wherein the drive circuit layer comprises a plurality of drive transistors, and the drive transistors are in one-to-one correspondence with the sub-printing regions in the printing region.

6. The display substrate according to claim 1, wherein in the direction perpendicular to the base substrate, a first define layer comprises a first hydrophilic material layer and a first hydrophobic material layer which are stacked, and the first hydrophobic material layer is located on a side of the first hydrophilic material layer away from the base substrate.

7. The display substrate according to claim 1, wherein in the direction perpendicular to the base substrate, the second define layer comprises a second hydrophilic material layer; or, the second define layer comprises a second hydrophilic material layer and a second hydrophobic material layer located on a side of the second hydrophilic material layer away from the base substrate.

8. A display apparatus, comprising a display substrate which comprises a base substrate and a pixel define layer disposed on the base substrate, wherein the pixel define layer comprises first define layers and a second define layer, a printing region is formed on the base substrate between the first define layers, and the second define layer is disposed on the printing region and divides the printing region into two sub-printing regions, and a height of the first define layers is greater than a height of the second define layer in a direction perpendicular to the base substrate, wherein in the direction parallel to the base substrate, the first define layer is regular hexagonal, the printing region is regular hexagonal, and the two sub-printing regions are symmetrically disposed at two sides of the second define layer;

wherein sub-printing regions in at least two of the adjacent printing regions are combined to form a pixel region; wherein in the direction parallel to the base substrate, the pixel region is triangular.

9. The display apparatus according to claim 8, wherein in the direction perpendicular to the base substrate, a height of the second define layer is ⅓ to ¾ of a height of the first define layers.

10. The display apparatus according to claim 8, wherein the display substrate further comprises a drive circuit layer disposed on the base substrate, the drive circuit layer comprises a plurality of drive transistors, and the drive transistors are in one-to-one correspondence with the sub-printing regions in the printing region.

11. The display apparatus according to claim 8, wherein in the direction perpendicular to the base substrate, the first define layer comprises a first hydrophilic material layer and a first hydrophobic material layer which are stacked, and the first hydrophobic material layer is located on a side of the first hydrophilic material layer away from the base substrate.

12. The display apparatus according to claim 8, wherein in the direction perpendicular to the base substrate, the second define layer comprises a second hydrophilic material layer; or, the second define layer comprises a second hydrophilic material layer and a second hydrophobic material layer located on a side of the second hydrophilic material layer away from the base substrate.

\* \* \* \* \*